United States Patent [19]

Monie et al.

[11] Patent Number: 4,894,829
[45] Date of Patent: Jan. 16, 1990

[54] COMPREHENSIVE DESIGN AND MAINTENANCE ENVIRONMENT FOR TEST PROGRAM SETS

[75] Inventors: Vijaykumar S. Monie, Edina; Elaine N. Frankowski, Minneapolis; James A. Larson, Roseville; Stephen V. Metz, St. Paul; Mohammed Nasiruddin, St. Louis Park; Michael D. Reed, Minneapolis; Rose Mae M. Richardson, Roseville; Orvil E. Wilsey, Dayton; William T. Wood, Crystal, all of Minn.

[73] Assignee: Honeywell Inc., Minneapolis, Minn.

[21] Appl. No.: 184,536

[22] Filed: Apr. 21, 1988

[51] Int. Cl.$^4$ ............................................. G06F 11/00
[52] U.S. Cl. .................................. 371/20.1; 371/16.1
[58] Field of Search .................... 371/20, 25, 29, 15, 371/16, 18; 364/200, 900, 300, 579, 580

[56] References Cited

U.S. PATENT DOCUMENTS

| | | | |
|---|---|---|---|
| 3,922,537 | 11/1975 | Jackson | 371/20 |
| 4,402,055 | 8/1983 | Lloyd | 371/20 |
| 4,718,064 | 1/1988 | Edwards | 371/20 |
| 4,736,374 | 4/1988 | Kemp | 371/20 |
| 4,794,599 | 12/1988 | Purcell | 371/20 |

*Primary Examiner*—Michael R. Fleming
*Attorney, Agent, or Firm*—Roger W. Jensen

[57] ABSTRACT

A source computer program for generating object computer programs, referred to as test program sets, for use in operating a particular automatic test equipment unit (ATE). The ATE is useable for testing a variety of electrical equipment type units each of which is referred to with relation to said ATE as a unit under test (UUT). The source program involves (1) having a test engineer, who designs the individual tests, enter the tests graphically at a work station, (2) verifying the match between the entered test design, the ATE capabilities and the UUT description, and (3) having an automatic way of generating a test program for a test program set from the stored semantic content of the graphically entered test design.

6 Claims, 6 Drawing Sheets

RF PULSED AMPLIFIER

TABLE 1    SPECIFICATION OF AMPLIFIER IN FIGURE 2

- PULSE TWT
- 10% DUTY CYCLE MAX.
  PRF RANGE 100 Hz TO 10 KHz
- 8 TO 16 GHz BANDWIDTH
- POWER OUTPUT ACROSS BAND
- @ 10% D.C.
  -- FROM 8 TO 16 GHz
  -- POWER IS > 60 dBm BUT < 65 dBm
- OFF POWER < -60 dBm

TABLE 2    TEST OBJECTIVES TO CHECKOUT CIRCUITRY IN FIGURE 2

| TEST | OBJECTIVE |
|---|---|
| *1 | VERIFY THAT THE POWER SUPPLY CAN PRODUCE THE REQUIRED OUTPUT POWER WITHOUT SETTING THE POWER SUPPLY STATUS AS BAD |
| 2 | VERIFY THAT THE HIGH VOLTAGE POWER SUPPLY CAN PRODUCE THE REQUIRED HIGH VOLTAGE WITHOUT ARCING. |
| *3 | VERIFY THAT THE GRID MODULATOR MONITOR CAN IDENTIFY MODULATIONS ABOVE 10% |
| 4 | VERIFY THAT THE GRID MODULATOR WILL NOT OUTPUT RF MODULATIONS ABOVE 10% |
| *5 | VERIFY THAT THE RF AMPLIFIER CAN PRODUCE THE REQUIRED RF OUTPUT POWER |

*EXEMPLIFIED IN FIGURE 5

*Fig. 3*

USER ENVIRONMENT IN TPS DEVELOPMENT
(WORK STATION)

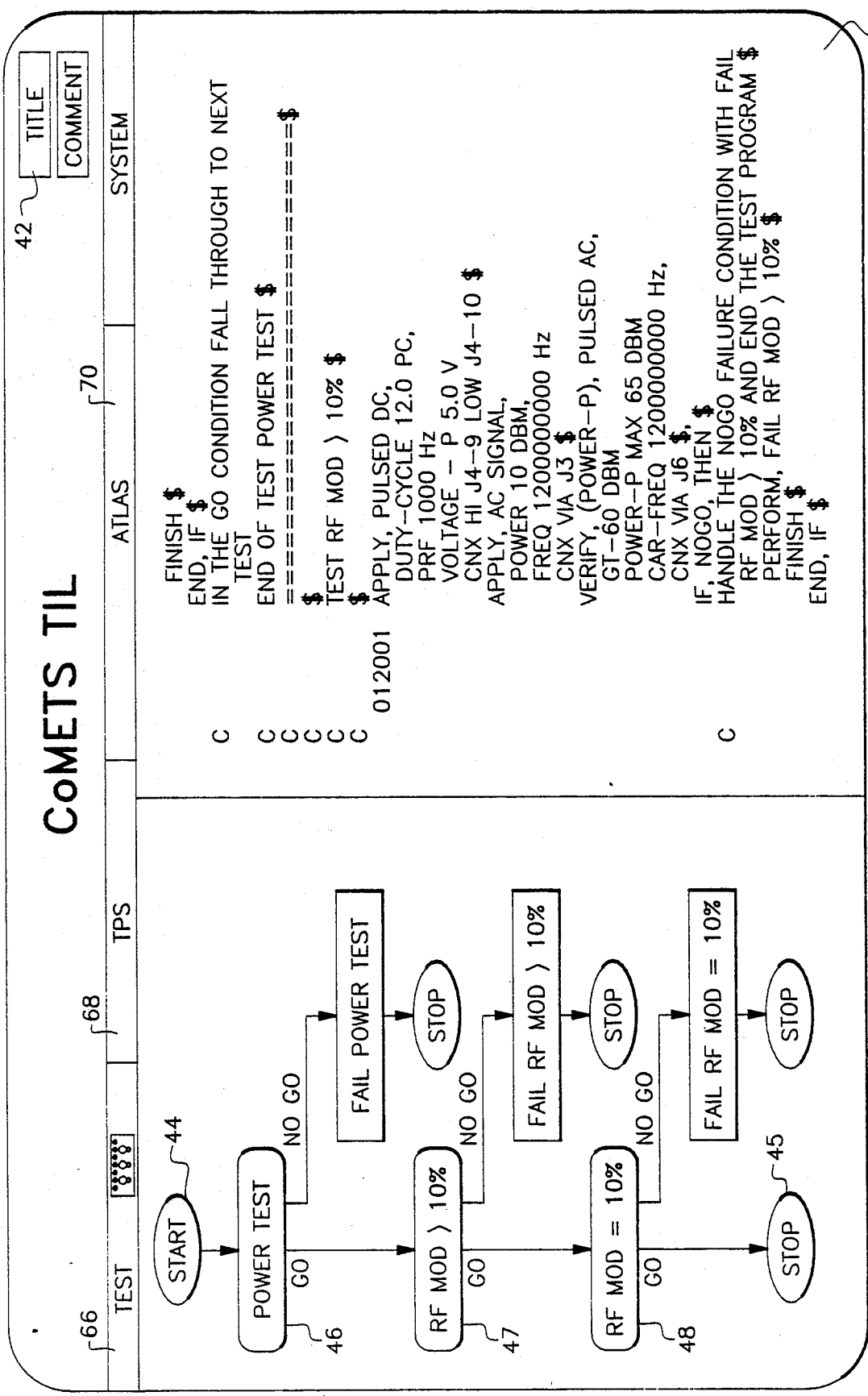
Fig. 5  COMPLETE ATLAS PROGRAM FOR A TARGET ATE SYSTEM IS PRODUCED AUTOMATICALLY FROM FLOW DIAGRAM

COMPREHENSIVE DESIGN AND MAINTENANCE ENVIRONMENT FOR TEST PROGRAM SETS

The invention relates to a comprehensive design and maintenance environment for test program sets.

There is presently a technology involving the testing of electrical units such as radio frequency (RF) hardware with automatic test equipment. For convenience herein an electrical unit to be tested is referred to as a unit under test (UUT) and an automatic test equipment unit is referred to as an ATE.

The UUTs of interest are quite large and typically have hundreds of test points for input, output and load terminals. The ATEs are of a general design and are computer driven. Each model of UUT to be tested requires a specially designed software program for the ATE which is often written in the ATLAS language. ATLAS, which stands for Abbreviated Test Language for All Systems, is a widely accepted standard in the avionics test industry. A test program for a UUT, including documentation and a hardware test fixture, is called a test program set (TPS).

A test engineer having detailed information about a UUT to be tested and an ATE must typically design literally hundreds of tests to be performed on the UUT by the ATE. These tests involve choosing input stimuli, output sensing devices and loads to be applied. The tests must also be arranged sequentially to form a test program.

If the test engineer also knows the ATLAS language he might himself develop the test program (part of a TPS) in ATLAS for operating the ATE or a programmer might be enlisted to do the programming.

Each of these alternatives, whether it involves one or two persons, is considered a very inefficient and unsatisfactory procedure for developing a TPS.

The invention herein is directed to the development of such test program sets by (1) having the test engineer, who designs the individual tests, enter the tests graphically at a work station; (2) verifying the match between the entered test design and ATE capabilities and UUT description; (3) having an automatic way of generating a test program (syntactically correct ATLAS code) for the TPS from the stored semantic content of the graphically entered test design; (4) having an automatic way of doing the electrical design of an interface test adapter (ITA); and (5) having an automatic way of generating and maintaining currency of associated documents.

The main object of the invention is to provide a new and improved way of developing test program sets.

Other objects of the invention will become apparent from the following description of the invention, the associated drawings and the appended claims.

In the drawings:

FIG. 3 shows two tables which contain the test specification and the test objectives that need to be implemented to test the UUT of FIG. 2;

Figure 4:
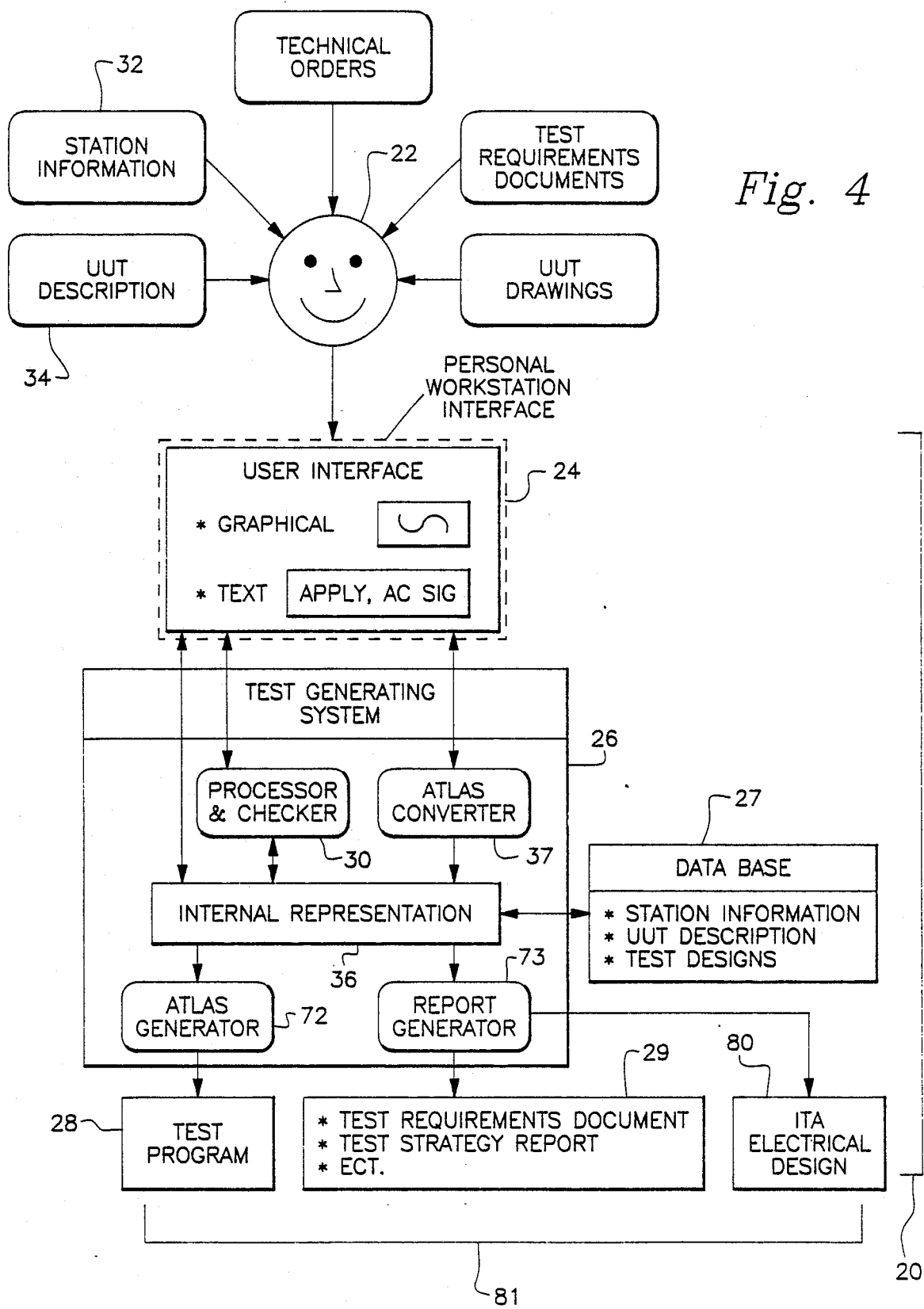
FIG. 4 is a block diagram of an interactive system logical structure for developing a test program set.
Figure 6A:
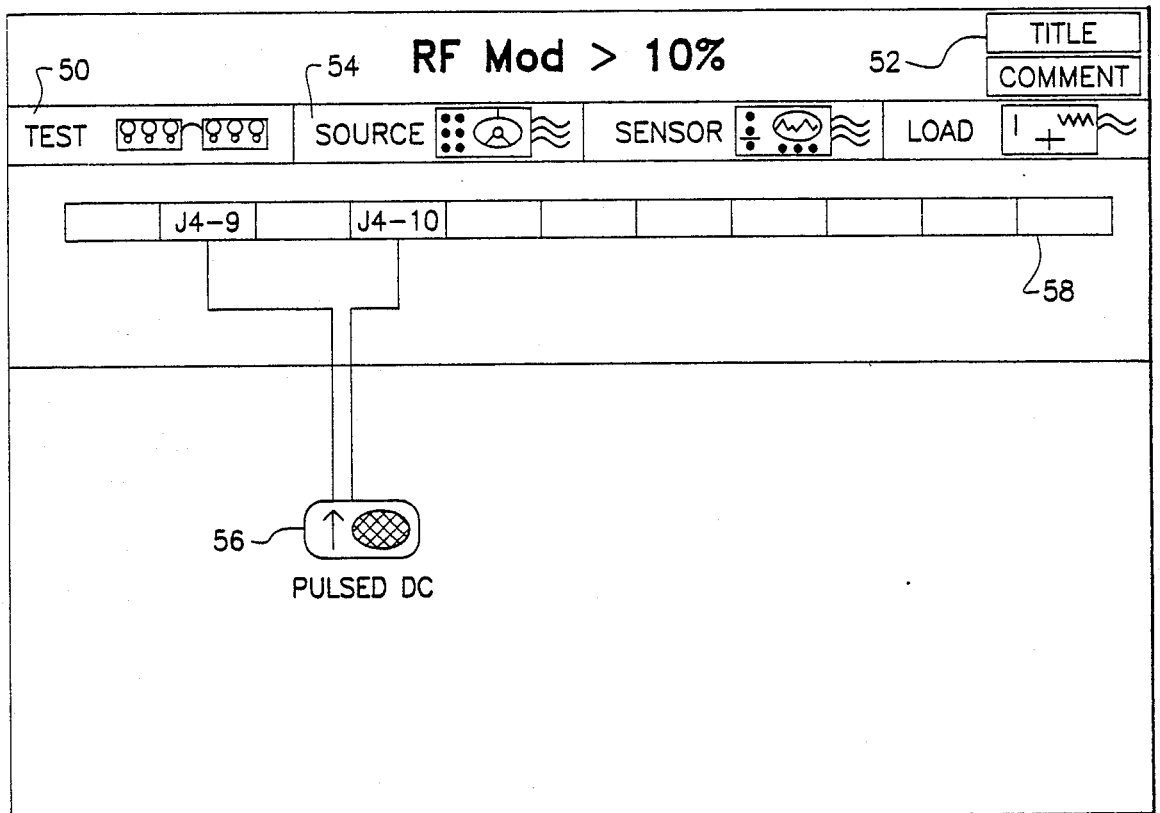
Figure 6B:
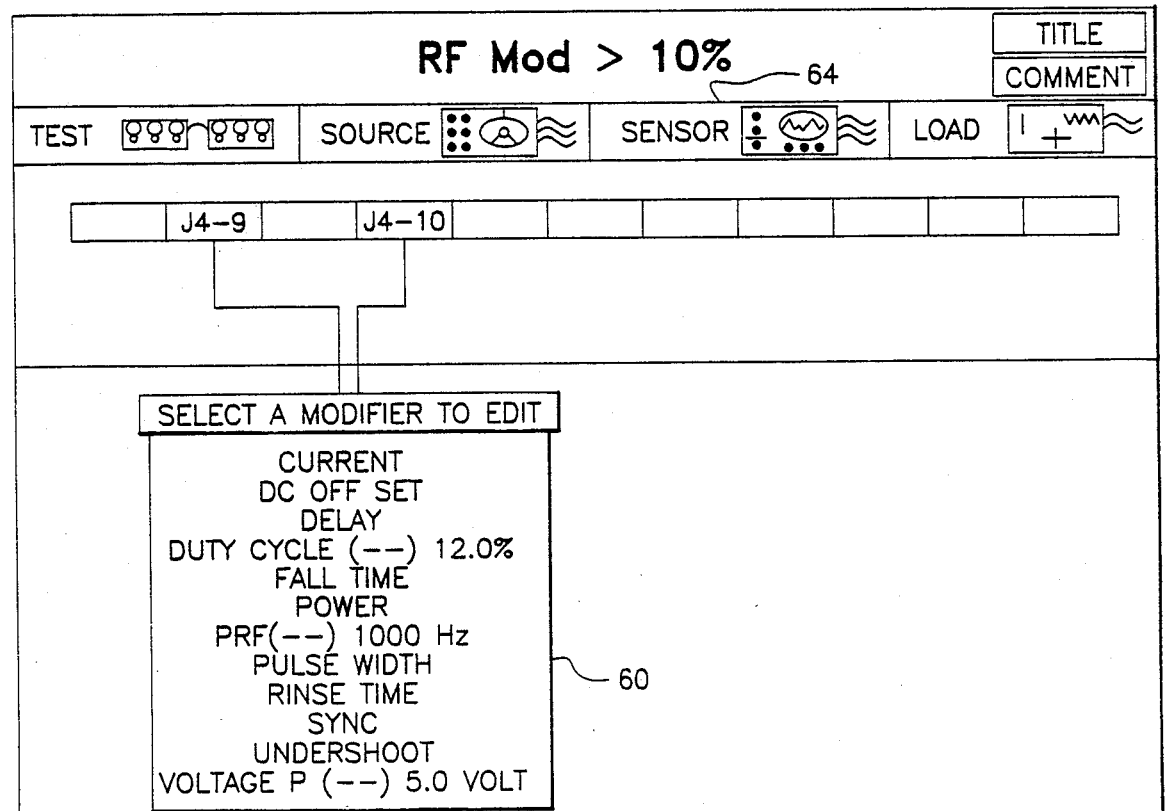
Figure 6C:
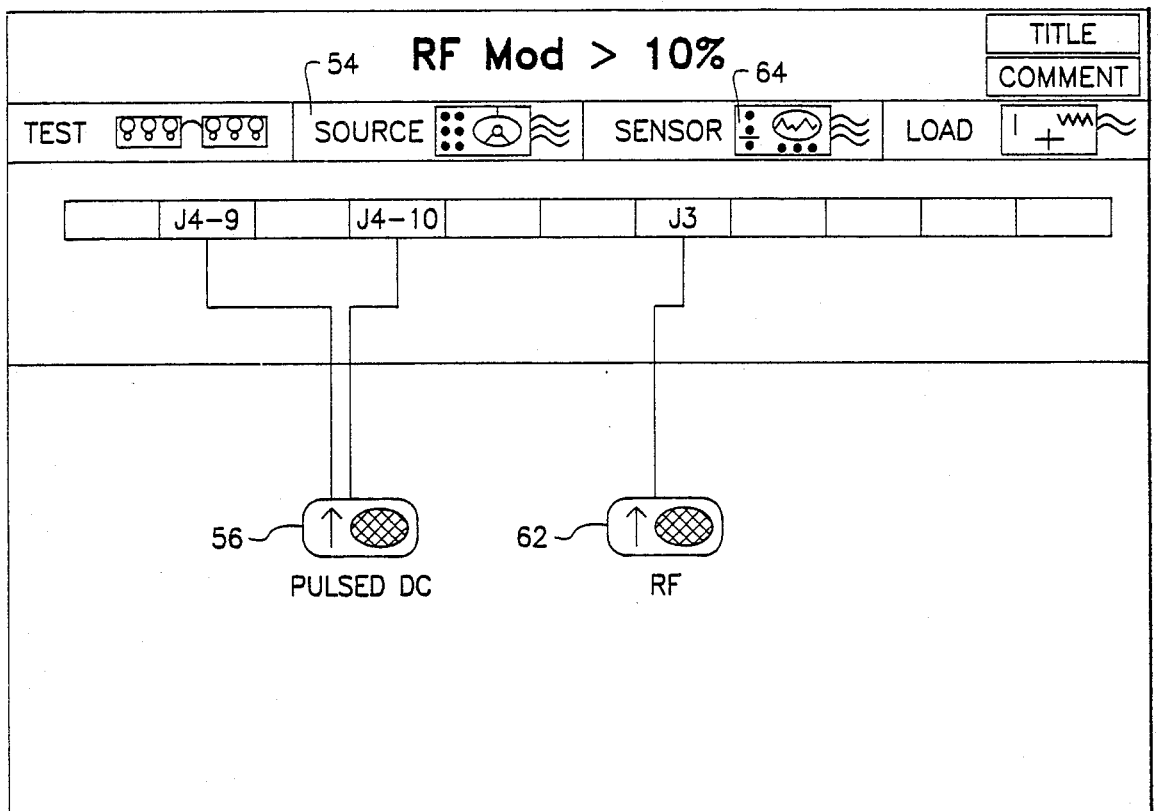
Figure 6D:
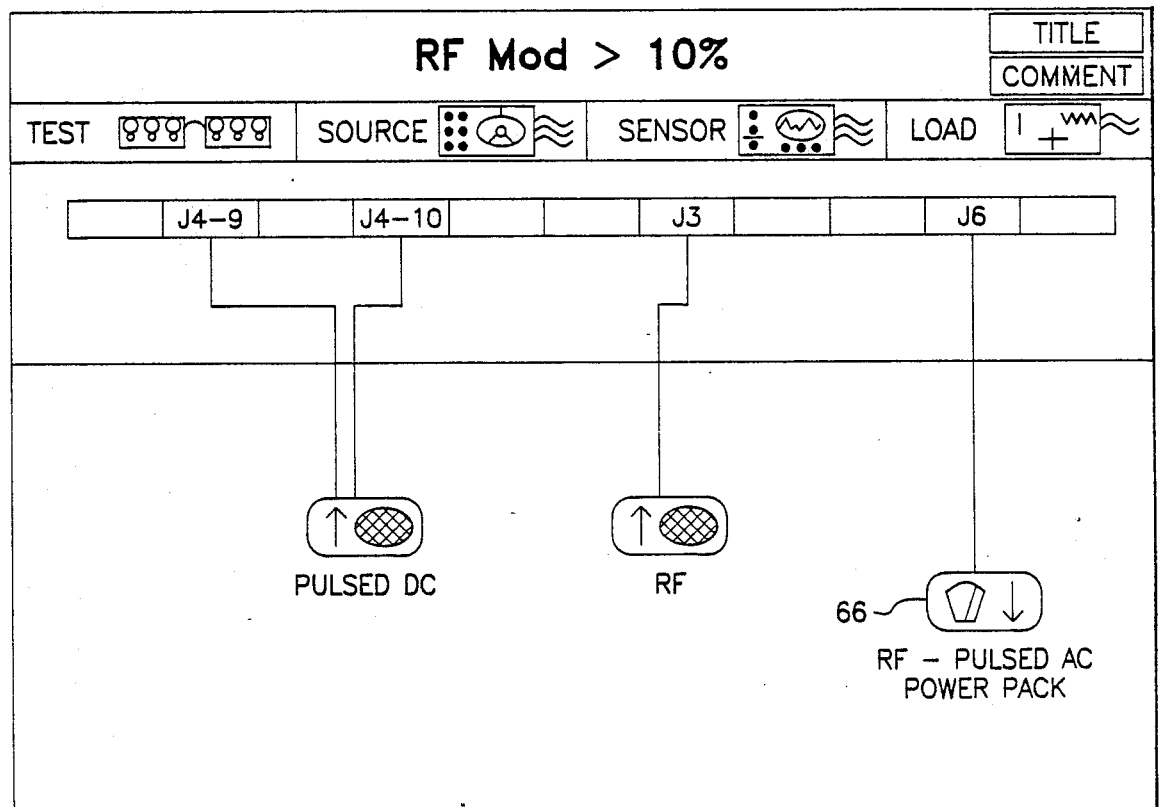

FIG. 5 is another illustration of the interaction screen of the user work station which shows on the left side thereof an abbreviated example of a test program designed graphically by a test engineer and the resulting automatically generated code for an ATE program on the right side thereof; and FIG. 6 shows screens a,b,c and d which illustrate the use of the interactive screen of the work station of FIG. 4.

Figure 1:
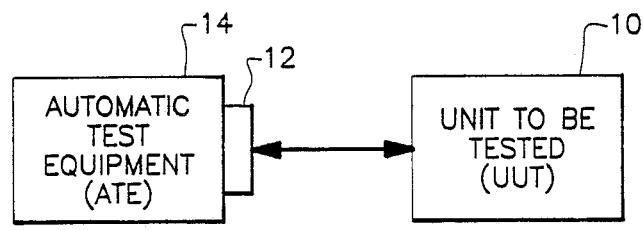
FIG. 1 is a representation in block form of an electrical unit to be tested (UUT) connected through an interface to an automatic test equipment unit (ATE)

Referring to FIG. 1, there is shown a representation in block form of an electrical unit 10 to be tested which is referred to as a unit under test (UUT). The UUT 10 is connected through an interface unit 12 to an automatic test equipment unit 14 which is referred to as an ATE.

Figure 2:
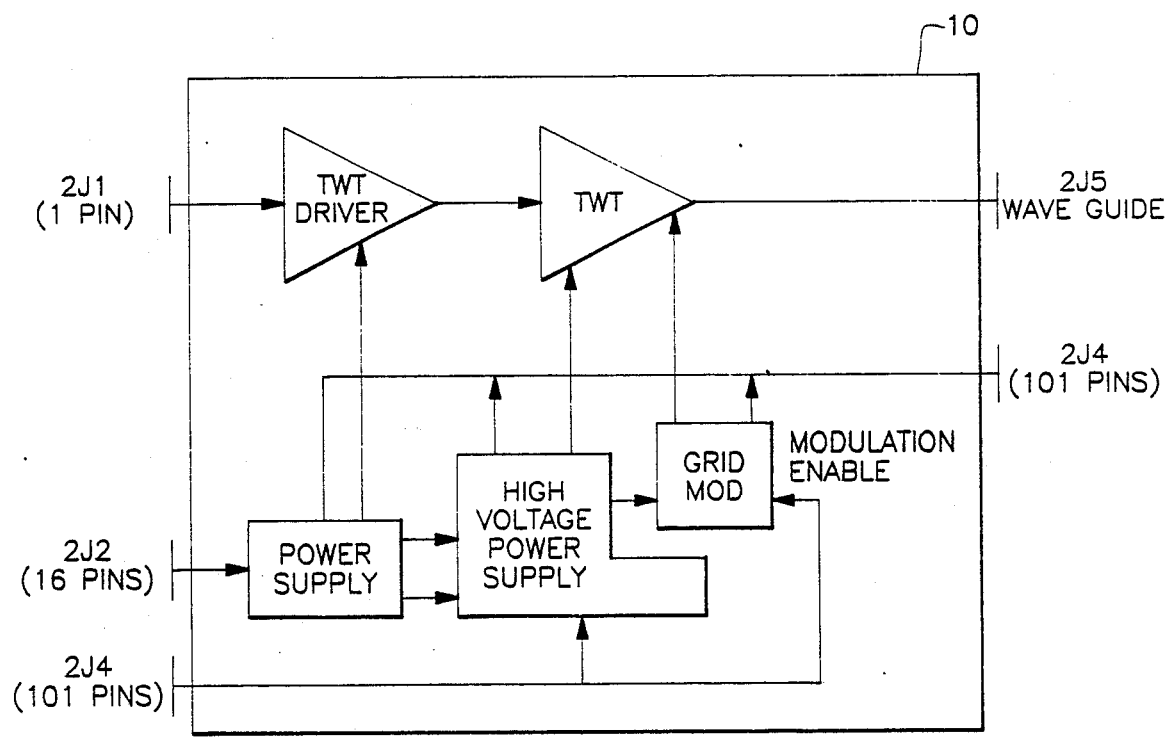
FIG. 2 is a block diagram of a specific type of UUT which may be tested pursuant to the invention.

FIG. 2 shows a block diagram of a specific type of UUT 10, which may be subjected to tests by an ATE 14, and which is illustrated as being an RF pulsed amplifier. The specification of the RF amplifier is set forth in Table 1 of FIG. 3 and the test objectives in checking the circuitry of the RF amplifier are set forth in Table 2 of FIG. 3.

ATE units such as the unit 14 are made in many different forms and sizes for testing a wide variety of electrical equipment.

An ATE unit 14 comprises an integrated collection of stimuli, load and measurement instruments under the control of one or more computers. Depending on the purpose of the ATE, it may typically comprise the following types of stimuli, load and measurement resources:

| | |
|---|---|
| Direct Current Power Supplies | Spectrum Analyzer |
| Alternating Current Power Supplies | Waveform Digitizer |
| Radio Frequency Power Sources | Peak and Average Power Meters |
| Electro Optical Sources | Counter Timers |
| Digital Pattern Generators | Oscilloscopes |
| Volt Meter | Communication busses |
| Ohm Meter | Impedances |
| Current Meter | |

The signals provided by the stimuli are routed within the ATE and delivered to an ITA which is represented by the interface unit 12 of FIG. 1. The ITA 12 is where the UUT 10 is mated to the ATE 14.

The routing of signals within the ATE is controlled by various switches and relays by which it is possible to deliver signals to the UUT to stimulate a particular segment of its circuitry. The resultant response from the UUT is then fed back to the ATE where it is routed to the appropriate measurement device. In tests in which the measured value is compared to known limits, the result of the comparison determines the next test with regard to the stimulus to be applied, the measured response thereto and the determination of the validity of the response.

The ATE computer communicates with and controls the ATE resources over communication busses using standard protocols.

A user of an ATE unit programs the computer thereof to control the sequence of tests by encoding the testing logic in a high level language such as ATLAS. The user can specify the parameters of the signals delivered within the capabilities of the ATE resources. Similarly, the ATE resources can measure specific parameters of the signals received from the UUT and communicate the result to the application software wherein the testing logic executes the next series of steps. In this manner the faults within the UUT may be determined and the operator is directed to take appropriate corrective action.

UUT's typically have hundreds of input and output pins as indicated by the block diagram of the RF pulsed amplifier of FIG. 2. Manufacturers of UUTs issue specifications and performance tests for these products which are the basis for tests which involve applying known signals to input pins and sensing the responses thereto of an UUT at the output pins thereof.

A test engineer will study the specifications and documentation of a UUT and design a series of perhaps hundreds of performance and diagnostic tests to be performed on a UUT by the ATE. Each test is designed to detect malfunctioning in a subcircuit which is of interest and a test program will normally include several hundreds of such tests.

In prior installations, it is the practice to utilize the services of a computer programmer to prepare a program based on the designed tests for operating the ATE. As an alternative, if the engineer who designed the tests might also have some programming expertise, he might then also prepare the test program.

In the invention herein a computer program is provided for the test engineer which has two basic functions. These functions are (1) to provide means for aiding the designing and maintaining of the tests, and (2) to provide means for automatically encoding the design results to form a test program set which comprises the test program, the ITA and associated documentation which will be used to operate the ATE 14 of FIG. 1.

The program embodying the invention herein has the name CoMETS which is an acronym for a Comprehensive design and Maintenance Environment for Test Program Sets. CoMETS is coded using the object-oriented programming language known as Smalltalk-80 ™.

CoMETS is useable on a continuing basis for producing programs to control ATEs in performing tests on a variety of UUTs. In this instance, the test programs so produced are encoded with the language ATLAS. The work station for the design engineer is a computer upon which the CoMETS environment is run.

FIG. 4 is a block diagram illustrating how a test program set, which includes a test program, is developed.

The personal workstation interface 24 is interactive and provides the means for a test engineer 22 to enter station information 32, UUT description 34 and test design data into the test program development system 20.

The test program development system 20 comprises a personal work station interface 24, a test generating system 26, and a data base 27 that is used for generating a test program set 81 which includes test program 28 having ATLAS source code, an ITA electrical design 80, and other associated reports 29. The test program 28 is used for operating the ATE 14 which will perform the required tests on the particular UUT 10 for which the test program set has been designed.

The test generating system 26 comprises a processor and checker 30, an ATLAS converter 37, the internal representation 36 of the data (station information 32, UUT description 34 and test designs comprising the TPS under development), an ATLAS generator 72, and a report generator 73.

The ATLAS converter 37 provides for the direct entry of ATLAS code to the work station interface 24. The ATLAS converter 37 converts the ATLAS code into the same internal representation in section 36 as that done by entry in the graphical mode.

The ATLAS generator 72 generates the test program 28 having ATLAS source code by converting the test design for the UUT 10 stored in the data base 27.

The report generator 73 will generate additional reports that are required. These reports include an updated test requirements document, a test strategy report, etc. In addition, the report generator also produces the electrical design for the ITA 12 (FIG. 1).

The test engineer 22 is shown as the recipient of the following data: station information 32, a UUT description 34, a test requirements document (TRD), UUT drawings, and technical orders relating to the ATE 14 and the UUT 10. The test engineer synthesizes this information and designs a test program.

The test engineer 22 first inputs the station information 32 into the test program development system 20 via the workstation interface 24. This information is stored in an internal representation 36 and also stored in the data base 27. The station information 32 is entered once for each ATE station.

The test engineer 22 then enters the UUT description 34 into the test program development system 20 via the workstation interface 24. This information is stored in an internal representation 36 and also stored in the data base 27. The UUT description is entered once for each UUT 10 being tested.

The test engineer 22 next enters the test designs from the data contained in the test requirements document, UUT drawings and technical orders. The test design data is entered graphically or textually into the test program development system 20 via the workstation interface 24. As test designs are entered, the processor and checker 30 checks that the test design is consistent with the UUT 10 and ATE 14 by validating entries against the station information 32 and UUT description 34.

In designing the test program, the CoMETS tool set provides significant productivity improvement. The TPS engineer is relieved of the burden of expressing a design approach in the test language, namely ATLAS. With CoMETS, the designed focuses attention on the design of the test and its position in the test flow, and not on the details of the implementation language. By capturing the test strategy in a logically understandable flow diagram, the TPS engineer can focus attention on improving the quality and integrity of the design.

The graphical representation of the test strategy is captured in an object oriented data base 27. As the design data is input, the data's validity, in terms of being able to produce a workable test program is checked against the station information 32 and UUT description 34. The station information 32 and UUT description 34 are stored in the object-oriented data base 27. The station information 32 defines the ATE environment such as the available resources and their functional parameters, routing of the signals within the ATE, mating data between the ATE and ITA, etc. The UUT description 34 defines the UUT relative to the input/output pins, signal types and their limiting parameters, etc. Mapping the design data against these data (ATE 32 and UUT 34 information) is key to ensuring the is resulting test program will execute on the ATE.

The UUT 10 illustrated in FIG. 2 has the specifications listed in Table 1 of FIG. 3. The test objectives to checkout the circuitry of the UUT are set forth in Table 2 of FIG. 3.

In designing the tests for the UUT, the test engineer will have available to him interactive screens 38 and 40, illustrated in FIGS. 5 and 6, of the work station interface 24 which are supported by CoMETS.

The CoMETS system may be used in many different scenarios. For example, at the start of a design session the screen 38 is brought up and the "Title" box 42 is activated to provide an identifying name for the test program 28. The test program might be given a suggestive name tying it to the UUT to be tested and such program will eventually appear between the main "Start" and "Stop" boxes 44 and 45 on the left side of the screen 38. Although only three tests 46, 47 and 48 are indicated for the purpose of illustration, a test program for a UUT will typically have hundreds of such tests.

After the test program is named, the screen 40 of FIG. 6 is brought up. Four stages a, b, c and d of the screen 40 are illustrated. CoMETS lets the TPS engineer set up individual tests with great ease as shown in FIG. 6. In the CoMETS tool set, the focus of the interface is shifted from a tool meant to help a user input correct statements to a tool meant to let the user concentrate on the design of a test.

The techniques herein allow a user to use icons representing physical entities with which the engineer is comfortable. The metaphor is that of an engineer at a work bench. The user graphically connects the symbols to represent a test set-up. Collections of these low level building blocks (icons) are used to represent complete tests. Next the user links the tests to establish a logical flow based on the test strategy.

The individual tests such as tests 46 to 48 are constructed by the use of graphical symbols and a combination of pull-down and pop-up menus. The concept helps the TPS engineer generate syntactically and semantically correct test programs in ATLAS by use of a friendly, well understood interface. The engineer constructs the test program test by test. However, it is not necessary for the user to have a complete understanding of the ATLAS language rules.

The user can control the flow of the test program; add and delete tests; alter the contents of specific tests; create libraries of tests; browse through tests; incorporate tests from the library; etc.

FIG. 6 illustrates the tests in testing the radio frequency hardware illustrated in FIGS. 2 and 3. Three separate setups were performed to generate a valid test. This exercise illustrated that the user did not need a complete understnding of ATLAS to generate valid tests.

FIG. 2 illustrates the block diagram of a test circuit frequently encountered in the radio frequency (RF) domain. Table 1 of FIG. 3 contains its specifications and Table 2 of FIG. 3 lists the test objectives that need to be implemented to satisfactorily test the circuitry of FIG. 2. The left side of the screen 38 of FIG. 5 is the representation of the three performance tests 46, 47 and 48 (of which as many as several hundreds are required) designed to check out the circuitry of FIG. 2.

Referring to the screen representations of FIG. 6 it is assumed that a test requirement document (TRD) describing the tests which are to be run on the UUT has been assembled. The TRD has schematic diagrams and descriptions of tests which are to be run. The test engineer brings up the screen 40 and he activates the test box 50. This brings up a menu for adding or deleting a test. He chooses to add a test and, after activating the title box 52, names the test "Power Test".

The "Power Test" is added in the same manner as the next test, "RF mod>10%", and will not be separately described.

After the "Power Test" is added, the test engineer again activates the test box 50 to facilitate adding the next test. He activates the title box 52 and names the test "RF mod>10%".

For this test he activates the SOURCE box 54 and from the resulting menu (not shown) he chooses the "PULSED DC" signal source which appears in the form of an icon 56 in screen 40a.

The format of screen 40 has a pin connection bar 58 formed by separate connection boxes representing input/output ports on the UUT. These boxes can be labled with UUT pin numbers to which chosen sources, sensors and loads can by symbolically connected.

In this case the source 56 is connected as to two boxes of the bar 58 which are given the pin connection labels J4-9 and J4-10. Identification of the selected source and pin numbers are stored in the data base 27 of the TPS development environment unit 20 (CoMETS) shown in FIG. 4.

The available parameters for the "PULSED DC" source 56 are accessed from a menu 60 (screen 40b) which is obtained by touching the icon 56. Means such as an "on screen" calculator (not shown) is provided to provide numerical values for the choosen parameters.

The test engineer again activates the SOURCE box 54 and from the resulting menu (not shown) he chooses the "RF" signal source which appears in the form of an icon 62 in screen 40c. The source RF is connected to a box of the bar 58 and given the pin connection label J3. This data is likewise stored in the data base 27.

Parameters or modifiers may be chosen for any source or sensor the same way as illustrated with respect to the source "PULSED DC".

The test engineer next activates the SENSOR box 64 and from the resulting menu (not shown) he chooses the "RF Pulsed AC Power Peak" which appears in the form of an icon 66 in screen 40d. This sensor is connected to a box of the bar 58 and given the pin connection label J6. Parameters or modifiers for this sensor may be chosen if desired or necessary in the same manner as for the sources as referred to above. This data is likewise stored in the data base 27.

This completes the entry of data for test 47 (FIG. 5) and the test engineer next proceeds to test 48.

Data for all of the tests 46 to 48 is converted for storage and stored into an object-oriented data base 27.

After the sources and sensors are selected for a test the "TEST" box 66 of screen 38 is activated and a menu (not shown) is produced which allows sensor choices for each test of GO/NO GO, High/Low and parameters such as = to, > or < than, etc.

Activation of the "TPS" box 68 facilitates linking all the tests 46 to 48 into a complete "test program" as shown on the left side of the screen 38 of FIG. 5. This is at the "test interconnection level" (TIL).

Finally, the "ATLAS" box 70 of screen 38 is activated and this causes the automatic generation of test program 28 using ATLAS code via the ATLAS GENERATOR 72 (FIG. 4) for the test program set 81 (FIG. 4) on the right side of the screen 38.

Each time the test engineer places an icon representing a device on the screen, an object representing the device is created in the internal representation. When the test engineer specifies attributes of the device, such as signal level or frequency, that information is automatically added to the internal object that represents it. When the test engineer connects the icon to the pin connection bar 58 (FIG. 6) the connection between the object representing the bar 58 and the icon is stored in the internal representation. Similarly, when the test engineer starts designing a new test an object is created to represent the test in the internal representation, and when the engineer specifies flow-chart connections between tests, such as between "Power Test" 46 and "Fail Power Test" (FIG. 5), the connection between the objects representing the two tests is stored in the internal representation. Thus as the test engineer proceeds, a hierarchical structure is created step by step that faithfully reflects the structure of the TPS and the definitions of the individual tests that make it up, as completely as the test engineer has defined them at that point.

Part of the definition of an object corresponding to a device or test is the method for generating the ATLAS code for itself, possibly including sending requests to the objects that represent its parts requesting them to generate the ATLAS for themselves. Thus the ATLAS for any part of a test program can be generated by sending a message to the object that represents it, requesting it to produce the code for itself.

At generation time a message is sent to each test in the test program flow to generate ATLAS. Each object in the test has attributes associated with it that identifies what ATLAS will be generated. When a test gets a message to generate ATLAS, each object presents its piece of ATLAS to the ATLAS generator which combines that information with other pertinent information and produces ATLAS code for viewing on the display window.

The overall design procedure may be summarized as follows:

A. The user designs a test by using a graphical interface to choose resources, signal parameters, pin connections, etc.

B. As the user builds the test, internally CoMETS collects the data objects that represent what he is designing.

C. The user describes the flow of the test program by connecting tests in a specific order in a test program flow.

D. The user may generate ATLAS for the test program flow (all tests included in the flow).

E. When ATLAS is generated, each test is sent a request to generate ATLAS.

F. When each test receives the message to generate, it sends a request to each of its data objects to generate ATLAS.

G. Each data object has information stored with it that describes the ATLAS it should generate. This is the ATLAS that is generated.

The overall effect is that after the test engineer enters the design of the tests graphically, the contents of the data base 27 are processed to produce a correct ATLAS program complete with the preamble and procedural statements.

It is claimed:

1. A source computer program for generating an object computer program for use in operating a particular automatic test equipment unit (ATE), said ATE being useable for testing a variety of electrical equipment type units each of which is referred to with relation to said ATE as a unit under test (UUT); said UUT being characterized by having labeled input, output and load terminals; said ATE being characterized by having a variety of power and signal stimuli resources with associated parameter values, a variety of sensor resources with associated parameter values, a variety of load applying resources with associated parameter values, and a computer facility which is programmable to apply parameter modified ones of said resources to selected ones of said terminals of said UUT to perform various desired tests on said UUT; said source program comprising:

lists of resources and respectively associated parameter values indexed relative to said resources of said ATE;

a database structure for storing data;

associated operational coding means for each of said resources of said lists to effect a programmed operation thereof;

interactive graphical facilities formatted to facilitate:
  (1) selecting the identities of desired ones of said resources from said lists;
  (2) selecting the identities of desired ones of said associated parameter values from said lists to define parameter modified ones of said resources;
  (3) storing said identities of selected ones of said resources and selected ones of said parameter values in said database structure;
  (4) selecting and storing in said database structure labels for said identities of said parameter modified resources corresponding to said UUT labeled input, output and load terminals;

conversion program means for accessing data in said database structure and utilizing said data to automatically generate an object program for use in operating a particular ATE by incorporating therein said associated operational coding means for operating selected ones of said parameter modified resources; and means for assembling and ordering said desired tests to form said object program.

2. A source computer program according to claim 1 wherein:

said object program is a test program set with subprograms comprising a test program for operating said ATE, a design program for designing said ITA, and a utility program for supplying documentation and related test reports;

said conversion program section having a code generator section for generating said test program and a report generator section for generating said design program and said utility program.

3. A source computer program according to claim 1 wherein:

said object program includes a test program having a particular code for operating said ATE;

said conversion program section having a code generating section for generating all or a portion of said test program with said particular code;

said source program having textual facilities for allowing the textual entry of design data into said database structure in the form of said particular code;

said source program having a converter for converting said textually entered design data into the same internal representation in said database structure as said data entered by said graphical facilities so that graphically and textually entered data are both accessible by said conversion program.

4. A source computer program according to claim 1 wherein:

said interactive graphical facilities allow the use of icons to represent physical entities and the graphical connection of symbols to construct individual tests, and said graphical facilities further allow the user to link tests to establish a logical flow.

5. A source computer program according to claim 1 wherein said parameter values of said sensors correspond to pass and fail criteria for said power and signal stimuli resources.

6. A source computer program according to claim 1 including means for forming individual test modules having pass and fail criteria and means for serially arranging a number of said modules to form an overall test program for said UUT.

* * * * *